United States Patent [19]

Lutfy et al.

[11] Patent Number: 4,486,273

[45] Date of Patent: Dec. 4, 1984

[54] SELECTIVE PLATING OF DIELECTRIC SUBSTRATES

[75] Inventors: Joseph P. Lutfy, Highland; Thaddeus J. Grabowski, Taylor; Robert G. Arnold, Rochester, all of Mich.

[73] Assignee: General Motors Corporation, Detroit, Mich.

[21] Appl. No.: 520,478

[22] Filed: Aug. 4, 1983

[51] Int. Cl.³ .................... C25D 5/02; C25D 5/54; C25D 5/34

[52] U.S. Cl. .................... 204/15; 204/18.1; 204/20; 204/30; 204/38 B

[58] Field of Search .................... 204/15, 18.1, 20–22, 204/30, 32 R, 37 R, 38 R, 29, 38 B; 427/43.1, 53.1, 304, 306

[56] References Cited

U.S. PATENT DOCUMENTS

| | | | |
|---|---|---|---|
| 3,122,449 | 2/1964 | Swanson | 204/20 X |
| 3,668,003 | 6/1972 | Furness | 427/306 X |
| 3,676,213 | 7/1972 | Marton | 427/306 X |
| 3,874,075 | 4/1975 | Lohse | 427/53.1 X |
| 3,915,809 | 10/1975 | Wheatley | 204/30 X |
| 4,016,050 | 4/1977 | Lesh et al. | 204/15 |

*Primary Examiner*—Donald R. Valentine
*Attorney, Agent, or Firm*—Lawrence B. Plant

[57] ABSTRACT

Process for the maskless electroplating of selective areas of a dielectric substrate comprising depositing an electroconductive film on the surface, evaporating a narrow band of the film off the surface to expose a narrow strip of substrate surrounding a zone of the film where electroplating is unwanted, immersing the substrate in an electroplating bath opposite an appropriate anode, and cathodizing only that portion of the film that covers the region sought to be plated. In one embodiment a laser beam is used to selectively evaporate electroless copper from the surface of an ABS substrate.

2 Claims, 6 Drawing Figures

SELECTIVE PLATING OF DIELECTRIC SUBSTRATES

This invention relates to the maskless electroplating of selected areas of a dielectric substrate.

BACKGROUND OF THE INVENTION

Dielectric substrates are typically electroplated by first depositing a thin, electrically conductive film on the surface and then cathodizing the film in a desired metal electroplating bath (e.g., copper, nickel, chrome, etc.) to deposit the desired metal layer atop the conductive film. The thin conductive film may be applied by any of a number of techniques including chemical deposition, vapor deposition, sputtering, etc. For polymeric substrates such as acrylonitrile butadiene styrene (ABS) or phenylene oxide the most popular filming technique involves electroless chemical deposition of nickel or copper. A number of commercially available systems have been developed for this purpose including: the Crownplate TM system marketed by the Shipley Company; the Macuplex TM system marketed by the MacDermid Company; and the Enplate TM system marketed by Enthone, Inc. While each of these systems differs somewhat from the other they perform the same function in essentially the same way. In this regard, the surface is cleaned, etched (e.g., in chromic acid or chromic-sulfuric acid), catalyzed (i.e., with tin plus palladium salts or a tin/palladium colloid), immersed in a nickel or copper bath to chemically deposit a nickel/copper film on the surface, and finally electroplated as desired. A variety of rinsing and neutralizing steps are interspersed between the aforesaid essential steps.

Heretofore electroplating selective areas of dielectric substrates has typically involved masking off the substrate to define those areas where plating was sought and to cover, or otherwise render inactive, those other areas which, but for masking, would receive a significant amount of electrodeposit (i.e., otherwise in a high current density region of the substrate). Demasking of the substrate followed plating. Masking and demasking operations are performed either during the preplating steps (i.e., up through the electroless Ni or Cu filming steps) or more usually during the electroplating step itself. Masking and demasking operations are so cumbersome and time-consuming that many platers find it more practical to simply electroplate the entire surface rather than mask and demask a part for selective plating. Such efforts to avoid masking/demasking are highly inefficient in that they: consume excess electrolytic metal and electrolyzing current; and reduce the number of parts that can be plated at any one time.

It is the principal object of the present invention to provide a maskless process for efficiently electroplating selective regions of a dielectric substrate. This and other objects and advantages of the present invention will become more readily apparent from the detailed description thereof which follows.

BRIEF DESCRIPTION OF THE INVENTION

The present invention comprehends a process for electroplating a selective region of a dielectric substrate by: (1) depositing a thin electroconductive film on the surface of the substrate; (2) destroying a narrow band of the film so as to expose a narrow strip of the dielectric substrate, which strip defines a zone of the film which is electrically isolated from the selective region; (3) immersing the substrate in an electroplating bath opposite a plating anode such that the metal receiving region to be plated and the zone where plating is to be avoided are in close electrolytic proximity to said anode; and (4) therein cathodizing only the selective region of the film so as to deposit electrolytic metal substantially exclusively on the selective region and not on the zone to be avoided.

As is well known in the art, the throwing power of a plating bath is a measure of the bath's ability to deposit metal onto cathodes or cathodic surfaces quite distant (i.e., via an electrolyte path) from the anode. In this context, the term "close electrolytic proximity", as used herein, means sufficiently close as to be within the range (i.e., distance wise) of the anode's ability to "throw" or deposit a significant amount of metal from a particular plating bath.

According to a preferred embodiment of the invention, an electroless copper film is deposited on an ABS substrate and a laser beam traced around the substrate to evaporate a narrow band of the copper so as to isolate the metal receiving region from the plating avoidance zone by a narrow strip of exposed nonconductive substrate. The path of the laser beam can be programmed to trace virtually any desired pattern on the substrate.

DETAILED DESCRIPTION OF THE INVENTION

The invention may better be understood by reference to the following detailed description of a preferred embodiment thereof which is given hereafter in conjunction with the several drawings in which.

Figure 2:
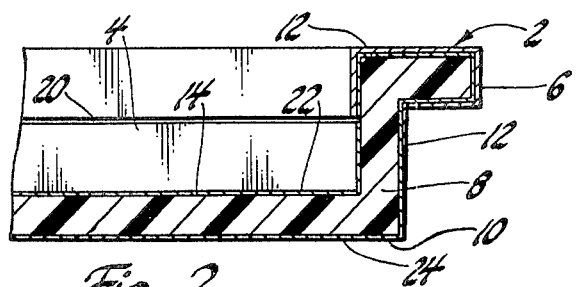
FIG. 2 is a partial elevational, sectional view taken in the direction 2—2 of FIG. 1.
Figure 4:
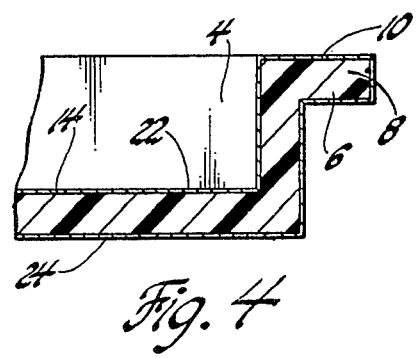

The several figures depict a tray 2 such, for example, as might be used to frame an automobile license plate. The tray 2 includes a recessed body portion 4 and a flanged rim 6. As best shown in FIG. 2, the tray 2 comprises a dielectric ABS substrate 8, an electrolessly deposited copper film 10 covering the entire surface 14 of the substrate 8 and a layer of electrolytic copper 12 covering substantially only the rim 6. Any number of additional electrolytic layers (e.g., nickel, chromium, etc.) may subsequently be applied to the electrolytic copper layer 12 as a given application might require. In the case of an ABS license plate tray, the rim would preferably be coated with successive additional layers of copper, nickel and chrome for maximum corrosion protection.

Figure 1:
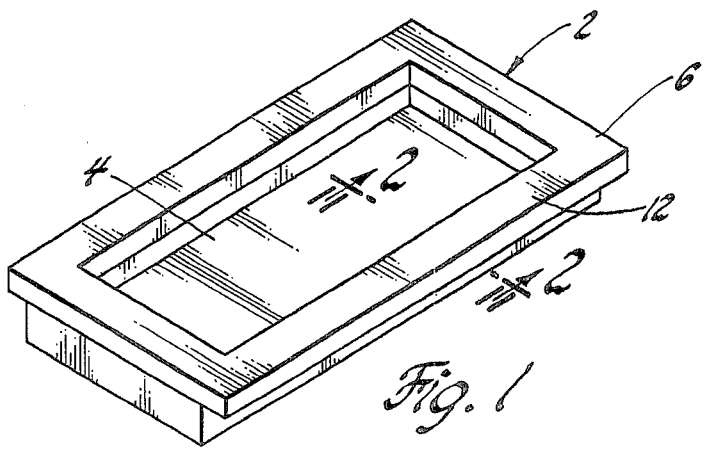
FIG. 1 is an isometric view of a plastic tray having a decoratively plated rim.
Figure 3:
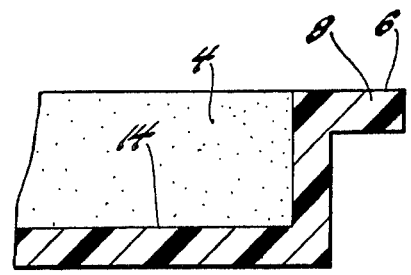
FIGS. 3-6 are views similar to FIG. 2 and depict the several stages of the process which is the subject of the present invention.

FIGS. 3-6 illustrate the several steps followed to produce the tray 2. FIG. 3 depicts only the ABS substrate 8 prior to coating. The tray 2 has a conductive film deposited (see FIG. 4) utilizing the aforesaid Macuplex TM preplating system wherein the substrate is essentially: cleaned, etched in a chromic acid solution to dissolve butadiene on the surface and leave a plurality of micro pits thereon as anchorage sites for the metal; neutralized to remove all traces of residual $Cr^{+6}$ which is poisonous to subsequent operations; activated in a muriatic acid-NaCl bath; catalyzed in a Sn-Pd emulsion; and finally filmed with copper 10 in a formaldehyde-type electroless copper plating solution.

As only the rim 6 is to be decoratively plated and unnecessary plating is to be avoided elsewhere, those areas of the film 10 which would otherwise see high plating current densities are electrically isolated from the rim 6. Accordingly the zone 22 of the copper film 10 which lies within the recessed portion 4 of the tray 2 is electrically isolated from the remainder of the film 10 and especially from that region of the film 10 which covers the rim 6. It is noted that the backside 24 of the tray 2 might also be similarly electrically isolated from the rim region of the film 10, but it is not absolutely necessary to do so. In this regard, since the backside 24 of the tray 2 will ultimately be located quite remote (i.e., electrolytically speaking) from the electroplating anode 28 during plating (see FIG. 6), there will be very little plating on the backside anyway.

Figure 5:
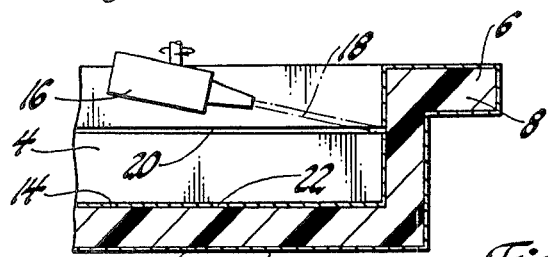
Figure 6:
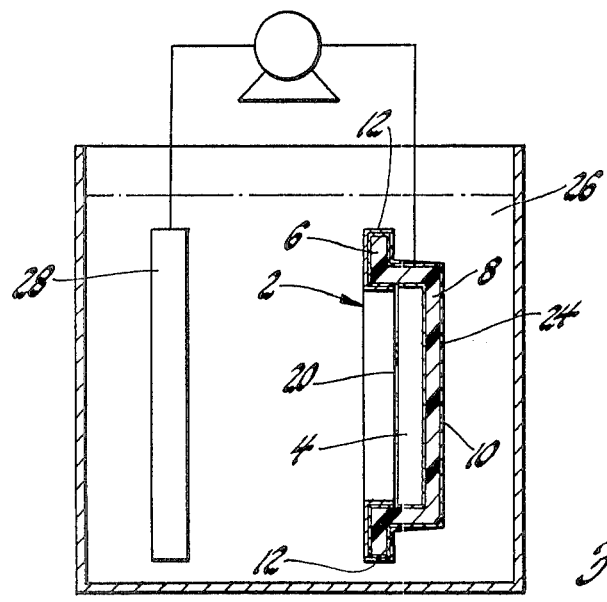

Isolation of the zone 22 from the remainder of the film 10 is preferably achieved by evaporating a narrow band of the electroless copper off of the substrate and thereby leaving a narrow strip 20 of dielectric exposed. Preferably and as best shown in FIG. 5, a laser generator 16 projects a beam 18 onto the film 10 and traces a path along the inside of the tray 2 contiguous the rim 6. The beam 18 is of sufficient intensity and breadth as to volatilize and remove a narrow (i.e., about ¾ of a millimeter or more wide) band of the copper film to expose a strip 20 of dielectric substrate 8. The strip 20, being nonconductive, electrically isolates the zone 22 from the remainder of the film 10 and especially the rim-covering portion thereof.

Following vaporization of the copper to form the isolation strip 20, the tray 2 is immersed in one or more conventional electroplating baths 26 as may be required to meet the particular needs of the part being plated. Electrolytic copper is preferred for the first layer because of its compatability with the electroless copper and its high electrical conductivity useful in the plating of subsequent layers. Whatever plating system is used, the portion of the conductive film 10 covering the rim 6 is cathodized in the plating bath opposite an appropriate anode 28. As illustrated, location of the parts is such that the rim 6 and the zone 22 are both so close to the anode 28 as to be well within its throwing range. As illustrated, the cathodized rim 6 will receive most of the electrodeposit 12, and those areas of the tray 2 (i.e., backside 24) more electrolytically remote from the anode 28 will receive little, if any, electrodeposit. The zone 22 of the film 10, however, being electrically isolated from the cathodized film 10 receives no plating current or electrodeposit even though it is well within the throwing range of the anode 28.

While this invention has been described in terms of a specific embodiment thereof it is to be understood that it is not limited thereto but rather only to the extent set forth hereafter in the claims which follow.

The embodiments of the invention in which an exclusive property or privilege is claimed are defined as follows:

1. In a process for metalizing a surface of a substantially dielectric substrate including the principal steps of electrolessly depositing a substantially continuous film of copper on said surface, immersing said substrate in a metal electroplating bath having an electroplating anode therein and cathodizing said film with respect to said anode to electrolytically deposite said metal on said film, the improvement comprising depositing said metal on only a selective region of said film by:

directing a narrow laser beam onto said film along a predetermined path to evaporate said copper off of said surface and expose a narrow strip of said substrate, said strip defining a zone of said film which is electrically isolated from said selective region;

positioning said selective region and said zone in close electrolytic proximity to said anode in said electroplating bath; and cathodizing only said selective region to coat said region with said metal without substantially coating said zone.

2. In a process for metalizing a surface of substantially dielectric substrate including the principal steps of depositing a substantially continuous conductive film on said surface, immersing said substrate in a metal electroplating bath having an electroplating anode therein, and cathodizing said film with respect to said anode to electrolytically deposit said metal on said film, the improvement comprising depositing said metal on only a selective region of said film by:

directing a narrow laser beam onto said film along a predetermined path, said laser beam having sufficient intensity to destroy said film along said path and expose a narrow strip of said surface, said strip defining a zone of said film which is electrically isolated from said selective region;

positioning said selective region and said zone in close electrolytic proximity to said anode in said electroplating bath; and cathodizing only said region to electrolytically metalize substantially only said region to the substantial exclusion of said zone.

* * * * *